(12) United States Patent
Noh et al.

(10) Patent No.: US 9,646,985 B2
(45) Date of Patent: May 9, 2017

(54) THREE-DIMENSIONAL NON-VOLATILE MEMORY DEVICE, MEMORY SYSTEM AND METHOD OF MANUFACTURING THE SAME

(71) Applicant: SK hynix Inc., Gyeonggi-do (KR)

(72) Inventors: Yoo Hyun Noh, Seoul (KR); Jong Moo Choi, Chungcheongbuk-do (KR); Young Soo Ahn, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 36 days.

(21) Appl. No.: 14/448,791

(22) Filed: Jul. 31, 2014

(65) Prior Publication Data

US 2014/0342519 A1 Nov. 20, 2014

Related U.S. Application Data

(62) Division of application No. 13/605,982, filed on Sep. 6, 2012, now abandoned.

(30) Foreign Application Priority Data

Dec. 19, 2011 (KR) .......................... 10-2011-0137331

(51) Int. Cl.
*H01L 29/76* (2006.01)
*H01L 27/11578* (2017.01)
*H01L 27/11582* (2017.01)
*H01L 21/266* (2006.01)

(52) U.S. Cl.
CPC ...... *H01L 27/11578* (2013.01); *H01L 21/266* (2013.01); *H01L 27/11582* (2013.01)

(58) Field of Classification Search
CPC .................. H01L 27/11578; H01L 21/266

USPC ................... 257/314, 324, E27.026
See application file for complete search history.

(56) References Cited

U.S. PATENT DOCUMENTS

| 8,159,017 | B2 | 4/2012 | Seol et al. | |
|---|---|---|---|---|
| 2002/0028541 | A1* | 3/2002 | Lee ................ | G11C 16/3427 438/149 |
| 2008/0164512 | A1* | 7/2008 | Rao ................ | H01L 21/84 257/323 |
| 2008/0258203 | A1* | 10/2008 | Happ ............ | H01L 21/84 257/324 |
| 2009/0008695 | A1 | 1/2009 | Chen et al. | |

(Continued)

FOREIGN PATENT DOCUMENTS

CN 101937919 1/2011

OTHER PUBLICATIONS

Office Action issued by the State Intellectual Property Organization for Chinese Patente Application No. 201210442592.3 on Jul. 13, 2016.

*Primary Examiner* — Asok K Sarkar
*Assistant Examiner* — Mark Hatzilambrou
(74) *Attorney, Agent, or Firm* — IP & T Group LLP

(57) ABSTRACT

A three-dimensional (3-D) non-volatile memory device includes channel structures each including channel layers stacked over a substrate and extending in a first direction, wherein the channel layers include well regions, respectively, vertical gates located and spaced from each other between the channel structures, and a well pick-up line contacting on the well regions of the channel layers and extending in a second direction crossing the channel structures.

11 Claims, 6 Drawing Sheets

(56) References Cited

U.S. PATENT DOCUMENTS

| | | | | |
|---|---|---|---|---|
| 2009/0251963 A1* | 10/2009 | Seol | ................... | G11C 16/0483 |
| | | | | 365/185.05 |
| 2010/0327323 A1* | 12/2010 | Choi | .................. | G11C 16/0483 |
| | | | | 257/202 |
| 2011/0163365 A1* | 7/2011 | Cannon | ............... | G11C 11/4125 |
| | | | | 257/299 |
| 2013/0015520 A1* | 1/2013 | Shosuke | ........... | H01L 27/11568 |
| | | | | 257/324 |

\* cited by examiner

THREE-DIMENSIONAL NON-VOLATILE MEMORY DEVICE, MEMORY SYSTEM AND METHOD OF MANUFACTURING THE SAME

CROSS-REFERENCE TO RELATED APPLICATION

This application is a division of U.S. patent application Ser. No. 13/605,982 filed on Sep. 6, 2012, which claims priority of Korean patent application number 10-2011-0137331 filed on Dec. 19, 2011. The disclosure of each of the foregoing application is incorporated herein by reference in its entirety.

BACKGROUND

Field of Invention

Embodiments of the present invention relate to a semiconductor device, a memory system and a method of manufacturing the same and, more particularly, to a three-dimensional non-volatile memory device, and a memory system and a manufacturing method of the same.

Description of Related Art

A non-volatile memory device retains data even in the absence of power supply. Two-dimensional memory devices in which memory cells are fabricated in a single layer over a silicon substrate have reaches physical limits in increasing their degree of integration. Accordingly, three-dimensional non-volatile memory devices in which memory cells are stacked in a vertical direction over a silicon substrate have been proposed.

Hereinafter, the structure of a three-dimensional (3-D) non-volatile memory device is described with reference to FIG. 1.

FIG. 1 is a perspective view illustrating the structure of a conventional 3-D non-volatile memory device.

As shown in FIG. 1, the conventional 3-D non-volatile memory device may include channel structures C, vertical gates 14 and word lines WL. The channel structures C may extend in parallel along a first direction I-I'. The vertical gates 14 may be located between adjacent channel structures C and protrude from the substrate 10. The word lines WL may be coupled to the vertical gates 14 and extend in parallel along a second direction II-II'.

Here, each of the channel structures C may include interlayer insulating layers 11 and channel layers 12 that are alternately stacked over the substrate 10. In addition, a tunnel insulating layer 13A, a charge trap layer 13B and a charge blocking layer 13C may be interposed between the vertical gates 14 and the channel structures C.

According to the above-described structure, a string may be arranged in a horizontal direction against the substrate 10. These strings may be stacked over the substrate 10. Therefore, as compared to a two-dimensional structure memory device, an integration degree of the 3-D memory device having the above structure may be increased. However, because a well region is not provided in a 3-D memory device, the 3-D memory device may have a low operating speed.

BRIEF SUMMARY

An embodiment of the present invention relates to a three-dimensional non-volatile memory device with improved operating speed, and a memory system and a manufacturing method of the same.

A three-dimensional (3-D) non-volatile memory device according to an embodiment of the present invention includes channel structures each including channel layers stacked over a substrate and extending in a first direction, wherein the channel layers include well regions, respectively, vertical gates located and spaced from each other between the channel structures, and a well pickup line contacting on the well regions of the channel layers and extending in a second direction crossing the channel structures.

A memory system according to another embodiment of the present invention includes a three-dimensional (3-D) non-volatile memory device including channel structures each having channel layers that are stacked over a substrate and includes respective well regions, vertical gates located and spaced from each other between the channel structures, and a well pickup line contacting on the well regions the channel layers and extending in a direction crossing the channel structures, and a memory controller configured to control the 3-D non-volatile memory device.

A method of manufacturing a three-dimensional (3-D) non-volatile memory device according to yet another embodiment of the present invention includes forming channel structures each including channel layers and interlayer insulating layers stacked alternately over a substrate, wherein the channel layers include well regions, respectively, forming vertical gates spaced from each other between the channel structures, and a well pickup line contacting on the well regions of the channel layers and extending in a direction crossing the channel structures.

DESCRIPTION OF EMBODIMENTS

Hereinafter, various embodiments of the present invention will be described in detail with reference to the accompanying drawings. The figures are provided to enable those of ordinary skill in the art to make and use the present invention according to the embodiments of the present invention.

Figure 3A:
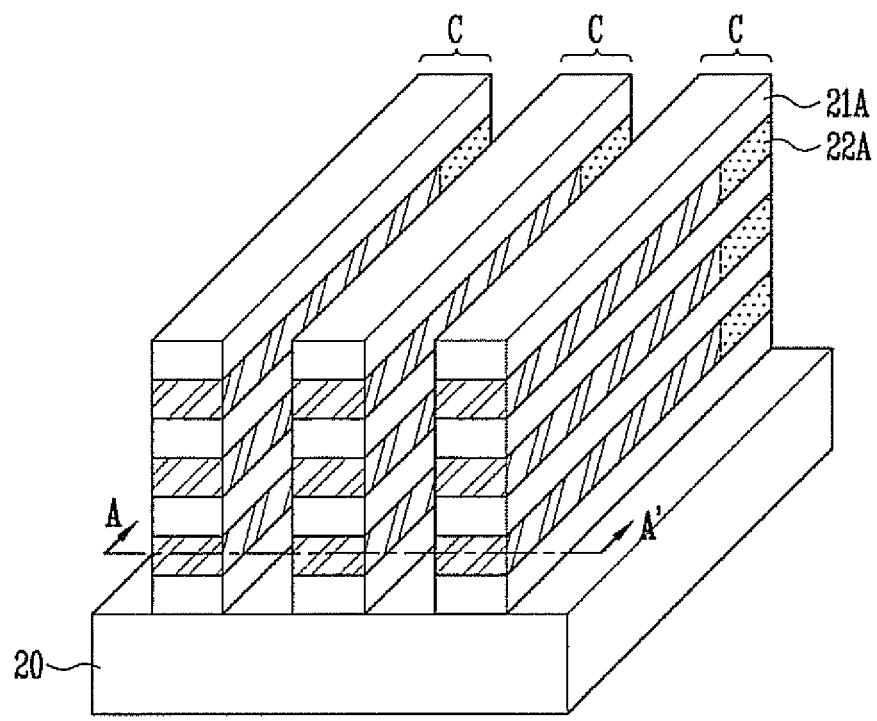
Figure 3B:
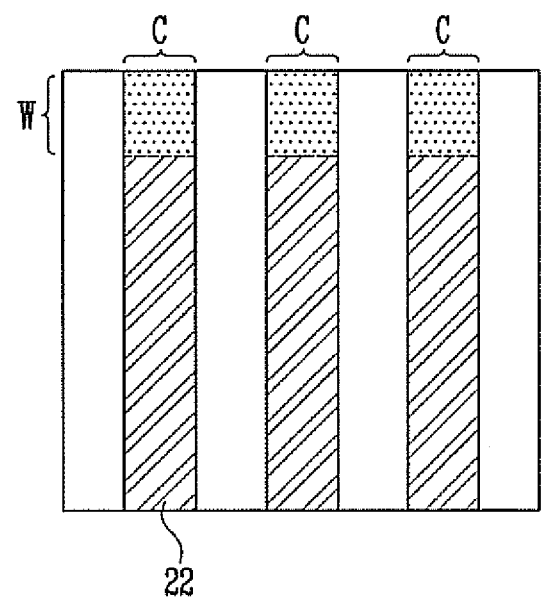
Figure 4A:
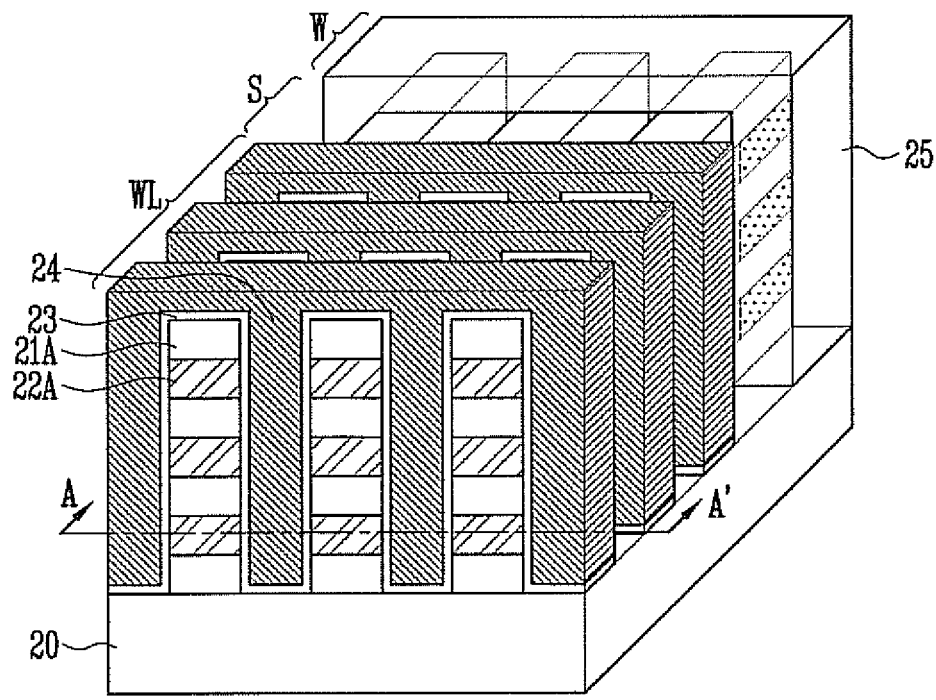
Figure 4B:
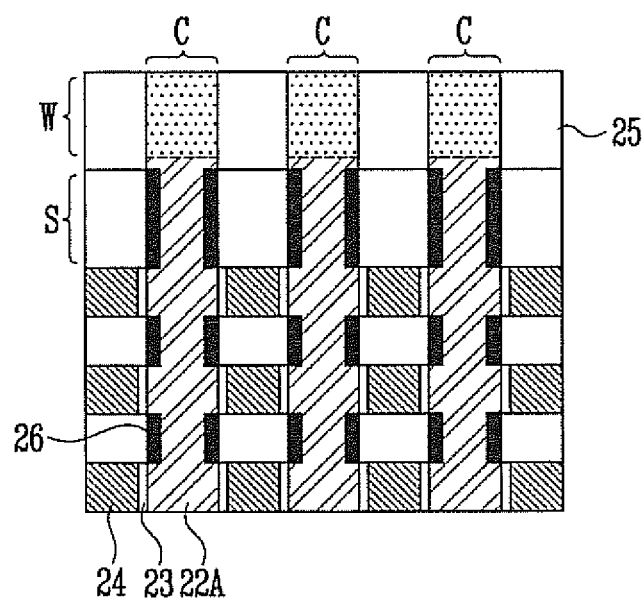
Figure 5A:
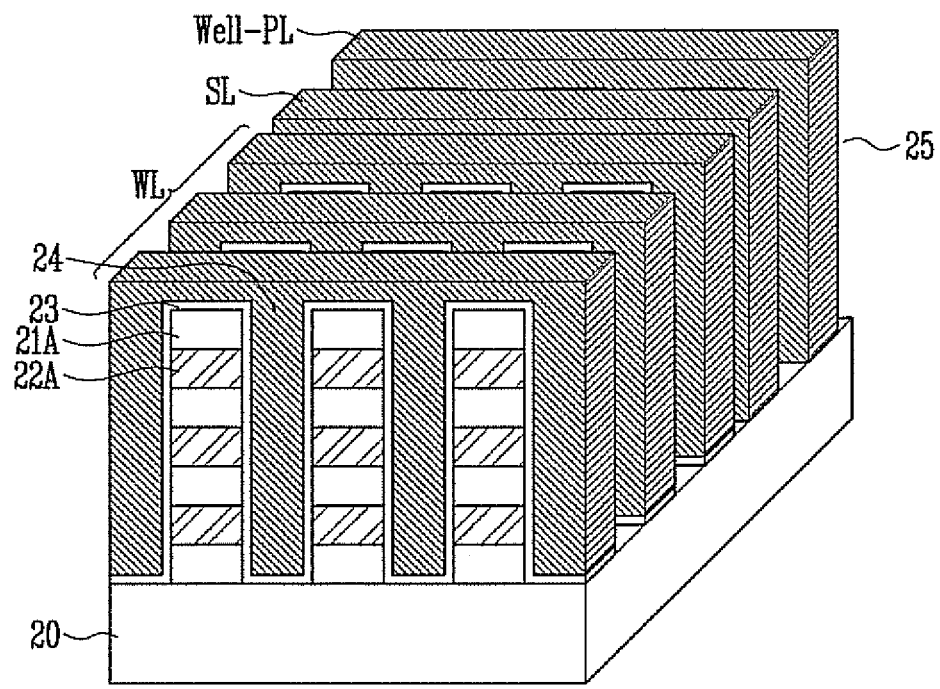
Figure 5B:
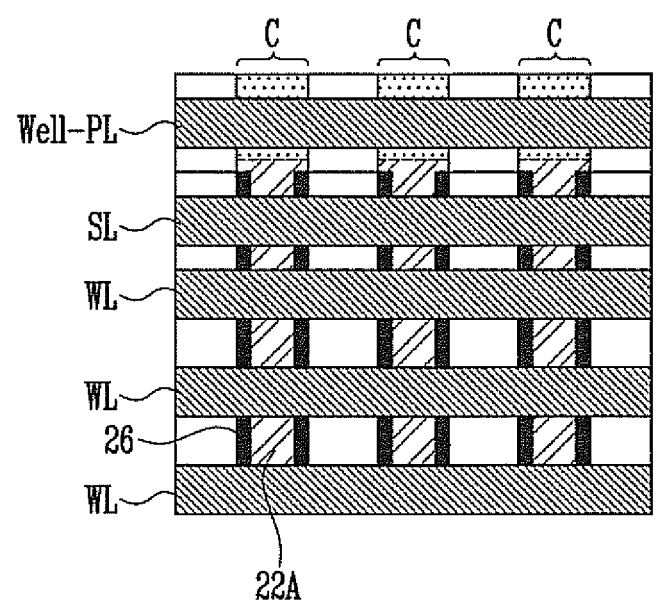

FIGS. 2A to 5B are views illustrating a method of manufacturing a three-dimensional (3-D) non-volatile memory device according to an embodiment of the present invention. FIGS. 2A to 5A are perspective views. FIGS. 2B to 4B are plan views taken along line A-A' of FIGS. 2A to 4A, respectively, and FIG. 5B is a top plan view of FIG. 5A.

Figure 1:
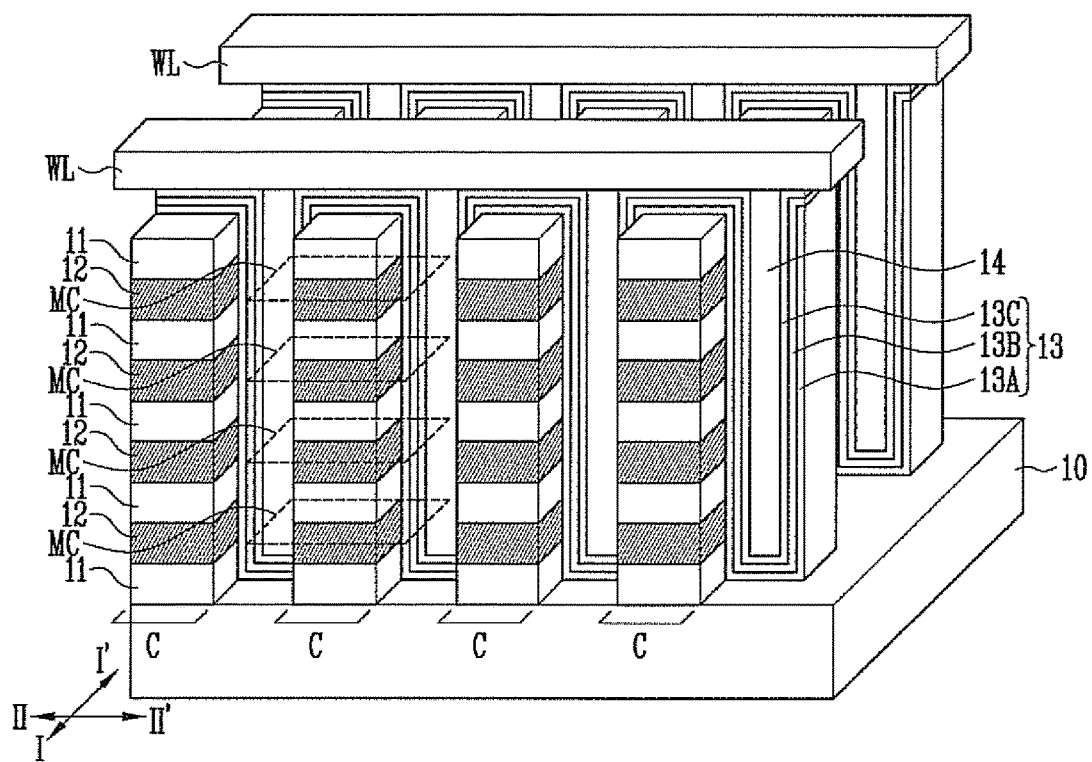
FIG. 1 is a perspective view illustrating the structure of a conventional three-dimensional (3-D) non-volatile memory device.
Figure 2A:
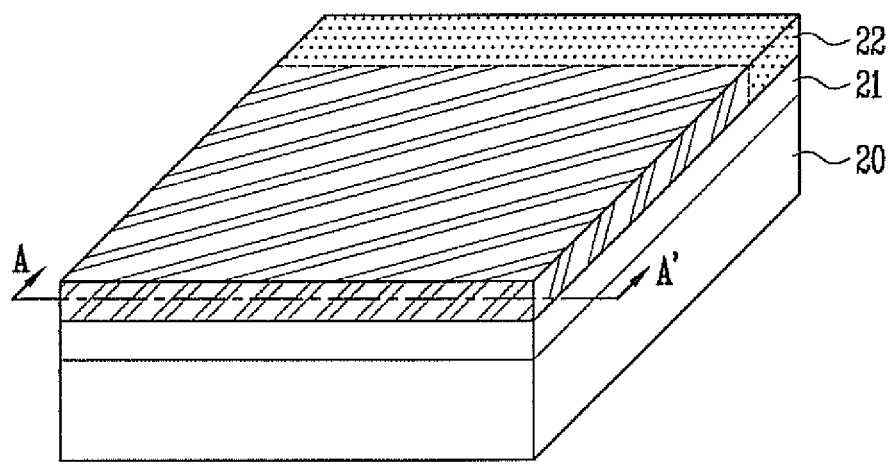
FIGS. 2A to 5B are views illustrating a method of manufacturing a 3-D non-volatile memory device according to an embodiment of the present invention.
Figure 2B:
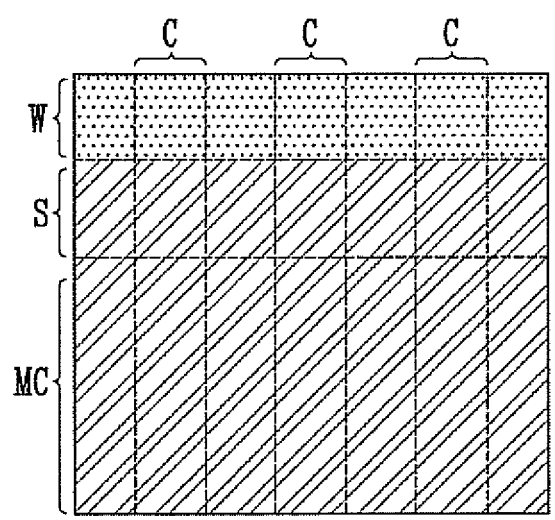

As illustrated in FIGS. 2A and 2B, an interlayer insulating layer 21 and a channel layer 22 may be formed over a substrate 20. Here, the interlayer insulating layer 21 may comprise an oxide layer. The channel layer 22 may comprise a semiconductor layer such as a polysilicon layer, or a polysilicon layer doped with P type impurities at a low concentration.

According to an embodiment of the present invention, channel structures C may be formed in subsequent processes. The channel structures C may include channel layers stacked over the substrate 20. Memory cells MC may be formed along sidewalls of the channel structures C. In addition, each of the channel layers may be doped with impurities to form a well region W and a source region S. For example, the well region W may be located at one end of each of the channel layers included in the channel structure C. The source region S may be located between the well region W and a region MC in which memory cells are formed. In FIG. 2B, positions of corresponding regions are indicated by dotted lines for illustration purposes.

A portion of the channel layer 22 may be doped with impurities to form the well region W. For example, a mask pattern (not shown) that exposes the portion of the channel layer 22 may be formed over the channel layer 22. Subsequently, the channel layer 22 may be doped with impurities by using the mask pattern as a barrier to thus form the well region W. The mask pattern may expose a portion of the channel layer 22 in which the well region W is formed, while the mask pattern may cover other portions of the channel layer 22 in which the source region S and the memory cells MC are formed. The channel layer 22 may be doped with impurities by using an ion implantation process or a plasma doping process. For example, the channel layer 22 may be doped with P-type impurities such as Boron (B). In this case, a P type well region W having a high impurity concentration may be defined in a P type channel having a low impurity concentration. More specifically, the well region W may include the same type of impurities as the channel layer 22, and the well region W may have a higher impurity concentration than the channel layer 22.

As illustrated in FIGS. 3A and 3B, the processes of forming the interlayer insulating layer 21, the channel layer 22 and the well region W may be repeated a number of times. In other words, the interlayer insulating layers 21 and the channel layers 22 may be alternately formed. Each time the channel layer 22 is formed, a portion of the channel layer 22 may be doped with impurities to form the well region W.

After the interlayer insulating layers 21 and the channel layers 22 are alternately formed by the number of strings to be stacked, the interlayer insulating layers 21 and the channel layers 22 that are alternately stacked may be etched to form the channel structures C. The channel structures C may extend in parallel along one direction. Therefore, the channel structures C may include channel layers 22A that are stacked over the substrate 20. Each of the channel layers 22A may include the well region W. Here, interlayer insulating layers 21A may be interposed between the channel layers 22A that are stacked.

For reference, after the channel structures C are formed, the well regions W of the channel layers 22A may be formed at the same time. For example, after the interlayer insulating layers 21 and the channel layers 22 may be alternately formed and subsequently etched to form the channel structures C, a mask pattern that exposes the well regions W may be formed. Subsequently, exposed regions of the channel layers 22A may be doped with impurities by using a tilting ion implantation process or a plasma doping process by using a mask pattern as a barrier. In this manner, the well regions W of the channel layers 22A stacked upon one another may be formed at the same time.

Here, since the well regions W are formed by doping the channel layers 22A exposed on sidewalls of the channel structures C with impurities, conditions of an impurity doping process may be controlled so that the center area of the channel layers 22 may be doped sufficiently.

As illustrated in FIGS. 4A and 4B, memory layers 23 may be formed. Each of the memory layers 23 may be formed over an entire surface of a resultant structure including the channel structures C. The memory layer 23 may be formed to store data by injecting/discharging charges. For example, the memory layer 23 may include a tunnel insulating layer, a charge trap layer and a charge blocking layer.

Subsequently, conductive layers 24 may be formed on the memory layers 23. The conductive layer 24 may have such a thickness that the conductive layer 24 may be filled between the channel structures C and may be formed on the top of the channel structures C. Subsequently, a mask pattern (not shown) in the form of lines that extend in parallel along a direction crossing the channel structures C may be formed over the conductive layer 24. Subsequently, the conductive layer 24 and the memory layer 23 may be etched by using the mask pattern as a barrier.

As a result, vertical gates and word lines WL may be formed. The vertical gates may be located between the channel structures C. The word lines WL may couple the vertical gates and extend in a direction crossing the channel structures C. Here, the memory layers 23 may be interposed between the word lines WL and the channel structures C. The memory cells MC may be formed along the sidewalls of the channel structures C.

Subsequently, a mask pattern 25 used to form a junction and a source region may be formed over a resultant structure having the word lines WL. For example, the mask pattern 25 may be a photoresist pattern. The mask pattern 25 may prevent the well regions W from being doped with impurities in subsequent impurity doping processes. The mask pattern 25 may have a large area enough to completely cover the well regions W. In addition, the mask pattern 25 may completely expose the source regions S and the region MC in which the memory cells MC are formed.

Subsequently, the channel layers 22A exposed between the mask pattern 25 and the word lines WL may be doped with impurities. For example, the channel layers 22A may be doped with N type impurities such as phosphorous (P) or phosphorous (As). In this case, N type junctions 26 and N type source regions S may be formed in P type channel layers 22A.

Here, sidewalls of the channel layers 22A exposed on both sidewalls of the channel structures C may be doped with impurities to form the junctions 26 and the source regions S. Here, the junctions 26 may be formed in each of the channel layers 22A exposed between the vertical gates 24. The source regions S may be formed on portions of the channel layers 22A. For example, each of the source regions S may be formed between the word lines WL and the well region W.

The sidewalls of the channel layers 22A may be doped with impurities by using a plasma doping process or a tilting ion implantation process in which ions are implanted while tilting the substrate. Here, the channel layers 22A may be doped with impurities from surfaces of both sidewalls thereof to a given depth. Conditions of an impurity doping process may be controlled to separate the junctions 26, the source regions S and the well regions W from each other.

As illustrated in FIGS. 5A and 5B, after the mask pattern 25 is removed, an interlayer insulating layer (not illustrated) may be formed over a resultant structure having the junctions 26. Here, the interlayer insulating layer may comprise an oxide layer.

Subsequently, the interlayer insulating layer may be etched to form a source line trench that exposes the source regions S of the channel structures C and a well pickup line trench that exposes the well regions W of the channel structures C. Subsequently, the source line trench and the well pickup line trench may be filled with conductive layers. Therefore, a source line SL and a well pickup line Well_PL may be formed. The source line SL may extend in the direction crossing the channel structures C and contact on the source regions S of the channel layers 22A. The well pickup line Well_PL may contact on the well regions W of the channel layers 22A.

Here, the source line SL and the well pickup line Well_PL may have structures substantially similar to the word line WL. The source line SL and the well pickup line Well_PL each may have vertical gate portions located between the channel structures C and line portions coupling the vertical gate portions.

A three-dimensional (3-D) non-volatile memory device according to an embodiment of the present invention may be manufactured by performing the aforementioned processes. The 3-D non-volatile memory device may include the channel structures C, the vertical gates 24, the junctions 26, the source line SL and the well pickup line Well_PL. The channel structures C may include the channel layers 22A stacked over the substrate 20. Each of the channel layers 22A may have the source region S and the well region W. The vertical gates 24 may be located between the channel structures C. The junctions 26 may be formed within the channel layer 22A exposed between the vertical gates 24. The source line SL may contact on the source regions S of the channel layers 22A and extend in the direction crossing the channel structures C. The well pickup line Well_PL may contact on the well regions W of the channel layers 22A and extend in the direction crossing the channel structures C.

In particular, source and drain regions of memory cells may be easily formed. In addition, the source region S and the well region W may be easily formed in each of the channel layers 22A stacked over the substrate 20. Therefore, a program speed of the memory device may be increased, and cell current may be increased, thus ensuring a sensing margin. In addition, contact resistance between the source line and the source region and between the well pickup line and the well region may be reduced to improve an erase speed.

Figure 6:
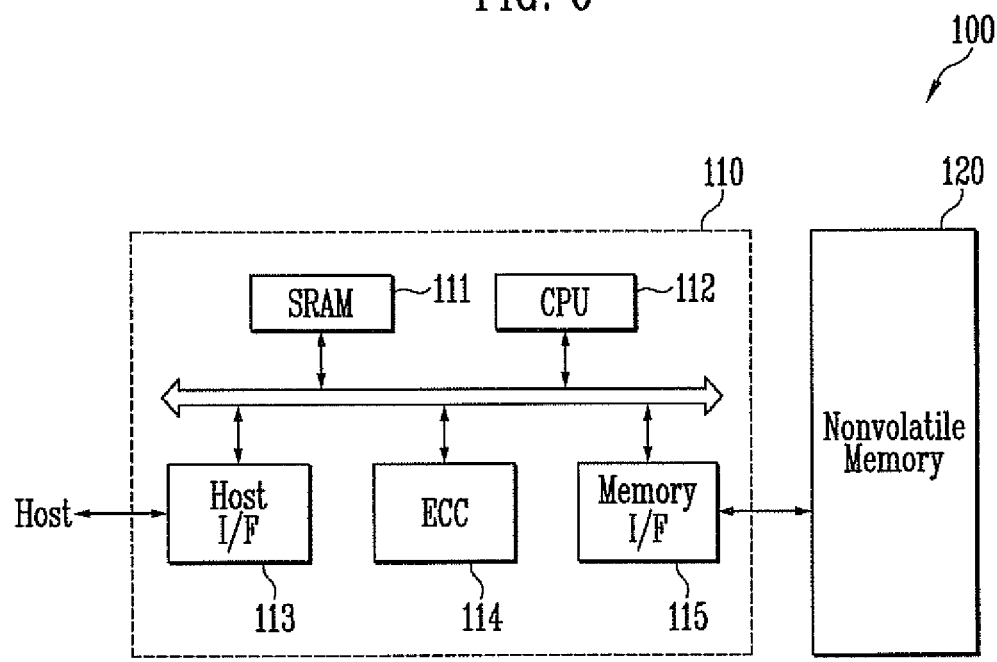
FIG. 6 is a block diagram illustrating a memory system according to an embodiment of the present invention.

FIG. 6 is a diagram illustrating a memory system according to an embodiment of the present invention.

As illustrated in FIG. 6, a memory system 100 according to an embodiment of the present invention includes a non-volatile memory device 120 and a memory controller 110.

The non-volatile memory device 120 may have the structure described in connection with FIGS. 2A to 5B. In addition, the non-volatile memory device 120 may be a multi-chip package composed of a plurality of flash memory chips.

The memory controller 110 is configured to control the non-volatile memory device 120. The memory controller 110 may include SRAM 111, a CPU 112, a host interface 113, an ECC 114 and a memory interface 115. The SRAM 111 may function as an operation memory of the CPU 112. The CPU 112 may perform the general control operation for data exchange of the memory controller 110. The host interface 113 may include a data exchange protocol of a host being coupled to the memory system 100. In addition, the ECC 114 may detect and correct errors included in data read from the non-volatile memory device 120. The memory interface 115 may perform to interface with the non-volatile memory device 120. The memory controller 110 may further include RCM that stores code data to interface with the host.

The memory system 100 having the above-described configuration may be a solid state disk (SSD) or a memory card in which the memory device 120 and the memory controller 110 are combined. For example, when the memory system 100 is an SSD, the memory controller 110 may communicate with the outside (e.g., a host) through one of the interface protocols including USB, MMC, PCI-E, SATA, PATA, SCSI, ESDI and IDE.

Figure 7:
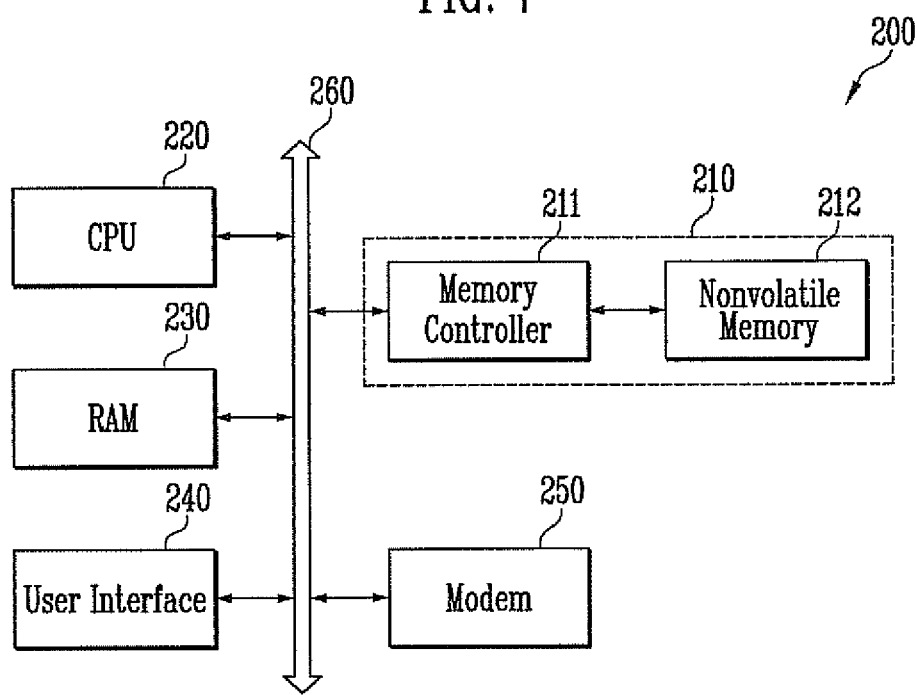
FIG. 7 is a block diagram illustrating a computing system according to an embodiment of the present invention.

FIG. 7 is a block diagram illustrating a computing system according to an embodiment of the present invention.

As shown in FIG. 7, a computing system 200 according to an embodiment of the present invention may include a CPU 220, RAM 230, a user interface 240, a modem 250 and a memory system 210 that are electrically coupled to a system bus 260. In addition, when the computing system 200 is a mobile device, a battery may be further included to apply operating voltage to the computing system 200. The computing system 200 may further include application chipsets, a Camera Image Processor (CIS), and mobile DRAM.

As described above with reference to FIG. 6, the memory system 210 may include a non-volatile memory 212 and a memory controller 211.

A 3-D non-volatile memory device may have a well region defined in each channel layer and have a junction formed between memory cells. Therefore, a program speed may be improved, and cell current may be increased, thus ensuring sensing margin. In addition, contact resistance between a source line and a source region and between a well pickup line and a well region may be reduced to thus improve an erase speed.

What is claimed is:

1. A method of manufacturing a three-dimensional (3-D) non-volatile memory device, the method comprising:
   forming an interlayer insulating layer;
   forming a channel layer on the interlayer insulating layer, wherein a memory cell region, a well region and a source region interposed therebetween are defined in the channel layer;
   selectively doping impurities into the well region of the channel layer so that the well region and the memory cell region include the same type of impurities, and the well region has a higher impurity concentration than the memory cell region;
   repeating the forming of the interlayer insulating layer, the forming of the channel layer and the doping of the impurities to form a stacked structure so that well regions of stacked channel layers overlap each other in a stacking direction;
   etching the stacked structure to form channel structures each including channel layers and interlayer insulating layers stacked alternately, wherein the channel layers include well regions, respectively; and
   forming a well pickup line directly contacting each of the well regions of the channel layers and extending in a direction crossing the channel structures.

2. The method of claim 1, wherein the channel structures extend in parallel along one direction.

3. The method of claim 2, wherein the forming of the channel structures further comprises:
   forming a mask pattern exposing portions of the channel structures corresponding to the well regions of the channel layers; and
   forming the well regions in the channel layers by doping the channel layers with impurities by using the mask pattern as a barrier.

4. The method of claim 1, wherein the doping of the impurities into the well region comprises:

forming a mask pattern exposing the well region of the channel layer; and doping the well region of the channel layer with impurities using the mask pattern as a barrier.

5. The method of claim 1, wherein the well region is formed at an end of the channel layer.

6. The method of claim 1, wherein each of the channel layers includes the memory cell region, the source region and the well region defined sequentially.

7. The method of claim 1, further comprising:

forming vertical gates spaced from each other between the channel structures.

8. The method of claim 7, wherein the forming of the vertical gates comprises:

forming a memory layer over an entire surface of the channel structures;

forming a conductive layer on the memory layer; and forming the vertical gates and word lines coupled to the vertical gates by etching the conductive layer and the memory layer, wherein the word lines extend in the direction crossing the channel structures.

9. The method of claim 7, further comprising:

forming a mask pattern on the channel structures after the forming of the vertical gates, the mask pattern covering the well regions of the channel layers and exposing memory cell regions and source regions of the channel layers; and selectively doping impurities into side walls of the channel layers using the mask pattern and the vertical gates as a barrier so that junctions are formed between the vertical gates in the memory cell regions and the source regions are doped with the impurities.

10. The method of claim 9, wherein the doping of the impurities into the side walls of the channel layers is performed by using a tilting ion implantation process or a plasma doping process.

11. The method of claim 9, further comprising:

forming a source line contacting the source regions of the channel layers and extending in the direction crossing the channel structures.

* * * * *